(12) United States Patent
Lee (10) Patent No.: US 8,860,452 B2
(45) Date of Patent: Oct. 14, 2014

(54) TESTER TO TEST A PLURALITY OF SEMICONDUCTOR DEVICES AND TEST SYSTEM INCLUDING THE SAME

(75) Inventor: Chang-hwan Lee, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 355 days.

(21) Appl. No.: 13/328,004

(22) Filed: Dec. 16, 2011

(65) Prior Publication Data

US 2012/0153982 A1 Jun. 21, 2012

(30) Foreign Application Priority Data

Dec. 20, 2010 (KR) ........................ 10-2010-0130941

(51) Int. Cl.
| | | |
|---|---|---|
| G01R 31/26 | (2014.01) | |
| G11C 29/00 | (2006.01) | |
| G11C 29/56 | (2006.01) | |
| G01R 31/319 | (2006.01) | |
| G01R 31/28 | (2006.01) | |
| G11C 29/26 | (2006.01) | |

(52) U.S. Cl.
CPC ........ *G01R 31/31908* (2013.01); *G11C 29/006* (2013.01); *G01R 31/2886* (2013.01); *G11C 29/56* (2013.01); *G11C 2029/5602* (2013.01); *G11C 2029/2602* (2013.01)
USPC ............. 324/756.03; 324/756.07; 324/762.06

(58) Field of Classification Search
None
See application file for complete search history.

(56) References Cited

U.S. PATENT DOCUMENTS

| | | | | |
|---|---|---|---|---|
| 6,028,439 | A * | 2/2000 | Arkin et al. ............... | 324/762.02 |
| 2003/0120985 | A1 | 6/2003 | Slobodnik et al. | |
| 2005/0086021 | A1* | 4/2005 | Khandros et al. ............. | 702/121 |
| 2006/0279306 | A1* | 12/2006 | Miyakawa et al. ........... | 324/763 |
| 2008/0235539 | A1 | 9/2008 | Yamada | |

FOREIGN PATENT DOCUMENTS

| | | |
|---|---|---|
| JP | 2010-15689 | 1/2010 |
| JP | 2010-112716 | 5/2010 |
| KR | 10-2009-0129747 | 12/2009 |

* cited by examiner

*Primary Examiner* — Minh N Tang
(74) *Attorney, Agent, or Firm* — Stanzione & Kim, LLP (57) ABSTRACT

Provided are a tester configured to test a semiconductor device and a test system including the same. The tester may include at least one contact unit and at least one memory controller. The contact unit is in contact with the semiconductor device. The memory controller is connected to the contact unit. The memory controller controls data input/output (I/O) operations of the semiconductor device and tests the semiconductor device.

18 Claims, 9 Drawing Sheets

TESTER TO TEST A PLURALITY OF SEMICONDUCTOR DEVICES AND TEST SYSTEM INCLUDING THE SAME

CROSS-REFERENCE TO RELATED APPLICATIONS

This application claims the benefit of Korean Patent Application No. 10-2010-0130941, filed on Dec. 20, 2010, in the Korean Intellectual Property Office, the disclosure of which is incorporated herein in its entirety by reference.

BACKGROUND

1. Field

The general inventive concept relates to a tester configured to test a semiconductor device and a test system including the tester, and more particularly, to a tester including a memory controller connected between a host and a semiconductor device and capable of testing the semiconductor device and a test system including the tester.

2. Description of the Related Art

A test process for determining whether a semiconductor device is good or defective may be greatly classified into a wafer-level test and a final test. The wafer-level test may be performed on individual semiconductor dies on a wafer level, while the final test may be performed on a semiconductor package in which individual semiconductor dies are packaged. Although the test process requires expensive tester equipment, a parallel test may be restricted by the number of channels of a tester. In particular, with an increase in the density of semiconductor devices and a rise in the demand for multichip packages (MCPs), test costs may be greatly increased

SUMMARY

The general inventive concept provides a tester capable of testing a plurality of semiconductor devices in parallel without using expensive tester equipment and a test system including the tester.

According to an exemplary embodiment of the general inventive concept, there is provided a tester that may include at least one contact unit and at least one memory controller. The at least one contact unit is in contact with a semiconductor device. The at least one memory controller is connected to the contact unit and configured to control data input/output (I/O) operations of the semiconductor device and test the semiconductor device.

The tester may further include a connection unit configured to connect the tester with a host. The memory controller may test the semiconductor device in response to a test request received from the host via the connection unit and transmit a test result to the host.

The memory controller may include a host interface configured to communicate with the host, a memory interface connected to the semiconductor device, a memory configured to store a test program required to test the semiconductor device, a processor configured to control the data I/O operations of the semiconductor device and test the semiconductor device according to the test program, and a bus configured to connect the host interface, the memory interface, the memory, and the processor with one another.

The tester may further include a wireless communication unit configured to wirelessly communicate with the host.

The memory controller may embed the test program therein as a firmware type and perform a self-test on the semiconductor device using the test program.

The memory controller may include at least one selected from the group consisting of a NAND flash memory controller, a NOR flash memory controller, a static random access memory (SRAM) controller, and a dynamic RAM (DRAM) controller.

A plurality of contact units may be provided and respectively in contact with a plurality of semiconductor devices. Accordingly, the plurality of semiconductor devices may be tested in parallel using one memory controller.

The memory controller may be connected to the plurality of contact units, control data I/O operations of the plurality of semiconductor devices connected respectively to the plurality of contact units, and simultaneously test the plurality of semiconductor devices. Also, a plurality of memory controllers may be provided and respectively connected to the plurality of contact units on a one-to-one basis. Also, the tester may have a flat panel structure having a first surface and a second surface disposed opposite the first surface. In this case, the plurality of contact units may be arranged on the first surface of the tester, and the plurality of memory controllers are arranged on the second surface of the tester. Also, the plurality of memory controllers may include different kinds of memory controllers.

The tester may be a probe card configured to test the semiconductor device. In this case, the semiconductor device may be a semiconductor die including a memory region in which data is stored. The contact unit may include needles respectively contacted with contact pads of the semiconductor device.

The tester may be a test board configured to test the semiconductor device. In this case, the semiconductor device may be a semiconductor package including a memory region in which data is stored. The contact unit may include a socket or a plurality of pogo pins corresponding to the semiconductor package.

The semiconductor device includes a NAND flash memory device, a NOR flash memory device, an SRAM device, or a DRAM device.

According to another exemplary embodiment of the general inventive concept, a test system may include a host configured to transmit a test request for a semiconductor device and receive a test result of the semiconductor device and at least one tester connected to the host. The tester may include a connection unit configured to connect the tester with the host, at least one contact unit contacted with the semiconductor device, and at least one memory controller connected between the connection unit and the contact unit and configured to control data input/output (I/O) operations of the semiconductor device, test the semiconductor device in repose to the test request of the host, and transmit the test result to the host.

A plurality of testers may be provided, connected to the host, and contacted with a plurality of semiconductor devices to test the semiconductor devices in parallel.

The memory controllers may embed a test program therein as a firmware type and performs a self-test on the semiconductor device using the test program in response to the test request of the host. Also, the test program may be downloaded from the host.

According to another exemplary embodiment of the general inventive concept, a tester configured to test a plurality of semiconductor devices may include: a plurality of contact units configured to establish contact with the plurality semiconductor device; and a plurality of memory controllers respectfully connected to each of the plurality contact units, and configured to control data input/output (I/O) operations of the plurality of semiconductor devices via the plurality of contact units so as to test the plurality of semiconductor devices.

The test may further include a first surface and a second surface opposite the first surface, the first and second surfaces being substantially parallel to one another, wherein the plurality of contact units are arranged on the first surface and the plurality of memory controllers are arranged on the second surface; and a connection unit configured to connect the tester to a host that transmits a test request to test the plurality of semiconductor devices and receives test results of the plurality of semiconductor devices.

According to another exemplary embodiment of the general inventive concept, the plurality of contacts units may be respectively arranged on the first surface at positions directly opposite to positions of the plurality of memory controllers arranged on the second surface.

According to another exemplary embodiment of the general inventive concept, the connection unit may be arranged on the second surface.

In this case, the connection unit may be arranged closer to a periphery of the second surface than plurality of memory controllers.

According to another exemplary embodiment of the general inventive concept, each of the plurality of memory controllers may include: a host interface configured to communicate with the connection unit; a memory interface configured to connect to at least one contact unit of the plurality of contact units; a memory configured to store at least one test program to test the plurality of semiconductor devices; a processor configured to control the data I/O operations of the plurality of semiconductor devices and to test the plurality of semiconductor devices according to the at least one test program; and a bus configured to connect the host interface, the memory interface, the memory, and the processor with one another.

Additional aspects and advantages of the present general inventive concept will be set forth in part in the description which follows and, in part, will be obvious from the description, or may be learned by practice of the general inventive concept.

BRIEF DESCRIPTION OF THE DRAWINGS

Exemplary embodiments of the general inventive concept will be more clearly understood from the following detailed description taken in conjunction with the accompanying drawings in which.

DETAILED DESCRIPTION OF THE EXEMPLARY EMBODIMENTS

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept. As used herein, the term "and/or" includes any and all combinations of one or more of the associated listed items.

The general inventive concept will now be described more fully hereinafter with reference to the accompanying drawings, in which exemplary embodiments of the inventive concept are shown. Further, like reference numerals refer to the like elements throughout.

Figure 1:
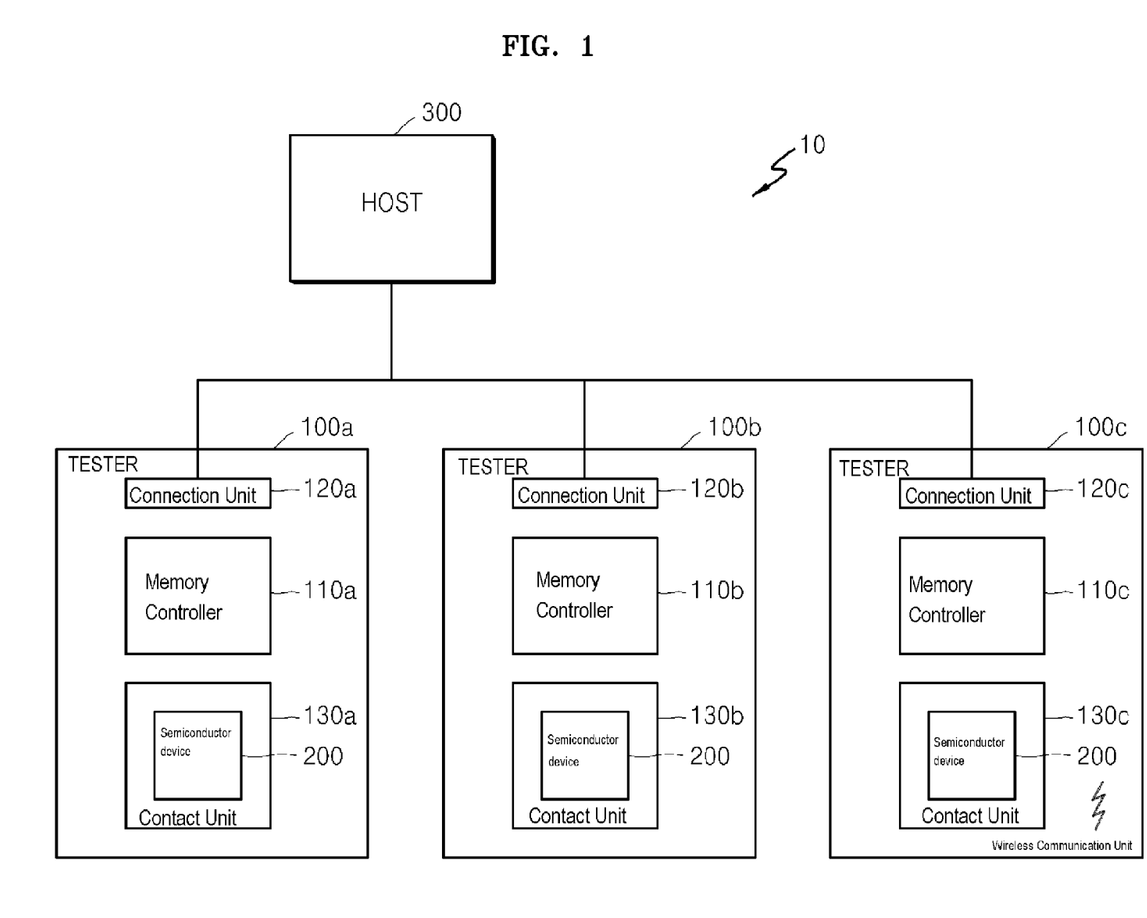
FIG. 1 is a schematic block diagram of a test system configured to test a semiconductor device according to an exemplary embodiment of the general inventive concept.

FIG. 1 is a schematic block diagram of a test system 10 configured to test system configured to test a semiconductor device according to an exemplary embodiment of the general inventive concept.

Referring to FIG. 1, the test system 10 may include a host 300 and a plurality of testers 100a, 100b, and 100c connected to the host 300.

The host 300 may be a general-use computer including an operating system (OS) and various applied software programs therein and designed to process required operations. For example, the host 300 may be a personal computer (PC) or workstation.

The host 300 may communicate with external peripheral apparatuses. For example, the host 300 may communicate with the external peripheral apparatuses using a serial communication system or a wireless communication system. The serial communication system may be, for example, a serial advanced technology attachment (SATA), a peripheral component interconnect express (PCI express), a serial attached small computer system interface (serial attached SCSI), a universal serial bus (USB), or a recommended standard 232 (RS-232). The wireless communication system may implement, for example, infrared data association (IrDA), radio frequency identification (RFID), wireless USB, near field communication, bluetooth, or WiFi, as well as other various wireless communication protocols within the 802.11 standard. As shown in FIG. 1, the testers 100a, 100b, and 100c may be connected to the host 300 so that the host 300 can simultaneously communicate with the testers 100a, 100b, and 100c. However, a method for a communication between the host 300 and the testers 100a, 100b, and 100c is not limited to the above-described methods.

The host 300 may transmit a test request to the testers 100a, 100b, and 100c and receive a test result and/or a test end signal from the testers 100a, 100b, and 100c. In another example, the host 300 may supply power to the testers 100a, 100b, and 100c. In yet another example, an additional power supply device may supply power to the testers 100a, 100b, and 100.

The testers 100a, 100b, and 100c may include memory controllers 110a, 110b, and 110c, connection units 120a, 120b, and 120c, and contact units 130a, 130b, and 130c, respectively. The testers 100a, 100b, and 100c may be directly connected to the host 300 through the contact units 120a, 120b, and 120c, respectively. Although all the testers 100a, 100b, and 100c have the same internal construction, the testers 100a, 100b, and 100c may be configured to test different kinds of semiconductor devices 200. For example, the tester 100a may test a flash memory, the tester 100b may test a static random access memory (SRAM), and the tester 100c may test a dynamic RAM (DRAM). Hereinafter, the testers 100a, 100b, and 100c may be inclusively called a tester 100. Similarly, the memory controllers 110a, 110b, and 110c, the connection units 120a, 120b, and 120c, and the contact units 130a, 130b, and 130c may be inclusively called a memory controller 110, a connection unit 120, and a contact unit 130, respectively.

The connection unit 120 may be electrically connected to the memory controller 110 and include an interface configured to connect the tester 100 with the host 300. That is, the connection unit 120 may include terminals to which respective interconnection lines of a connection cable connected to the host 300 are connected. In this case, the memory controller 110 of the tester 100 and the host 300 may directly transmit and receive data.

In another exemplary embodiment, the connection unit 120 may be a communication device configured to provide communication between the host 300 and the memory controller 110. The communication device may provide wired or wireless communication.

The contact unit 130 may be electrically connected to the memory controller 110 and contacted with a semiconductor device 200 to be tested by the test system 10. The semiconductor device may be referred to as a device under test.

The semiconductor device 200 may include a memory region in which data may be stored. For example, the semiconductor device 200 may include a large-scale integration (LSI) circuit including a data storage region. Also, the semiconductor device 200 may be a semiconductor memory, such as a NAND flash memory, a NOR flash memory, a static random access memory (SRAM), or a dynamic RAM (DRAM).

The semiconductor device 200 may be a semiconductor die to be packaged. In another example, the semiconductor device 200 may be a semiconductor wafer in which semiconductor dies are not diced. In yet another example, the semiconductor device 200 may be a semiconductor package in which a single semiconductor die is separately packaged or a multichip package (MCP) in which a plurality of semiconductor dies are packaged.

The semiconductor device 200 may include pins or contact pads configured to supply power to internal elements and receive and output control signals, address signals, and data signals. The contact unit 130 may include contacts configured to directly contact the pins or contact pads of the semiconductor device 200. The contacts may be needles or pogo pins. Also, the contact unit 130 may be a socket into which the semiconductor device 200 having a semiconductor package type may be inserted.

The memory controller 110 may be connected to the host 300 by wires or wirelessly through the connection unit 120. Also, the memory controller 110 may be connected to the semiconductor device 200 through the contact unit 130. The memory controller 110 may control data input/output (I/O) operations of the semiconductor device 200. The memory controller 110 may test the semiconductor device 200 in response to a test request of the host 300 and transmit a test result and/or a test end signal to the host 300.

The memory controller 110 may be a memory controller corresponding to the semiconductor device 200. For instance, when the semiconductor device 200 is a NAND flash memory, the memory controller 110 may be a NAND flash memory controller capable of controlling data I/O operations of the NAND flash memory. Also, when the semiconductor device 200 is a NOR flash memory, the memory controller 110 may be a NOR flash memory controller capable of controlling data I/O operations of the NOR flash memory. Also, when the semiconductor device 200 is an SRAM, the memory controller 110 may be an SRAM controller capable of controlling data I/O operations of the SRAM. In addition, when the semiconductor device 200 is a DRAM, the memory controller 110 may be a DRAM controller capable of controlling data I/O operations of the DRAM. In this case, the memory controller 110 may include a logic capable of refreshing the semiconductor device 200. However, the memory controller 110 is not limited to the above-described examples. Even if a new memory is developed, the memory controller 110 is not limited to a memory type but may be any controller capable of supporting an interface with the new memory. Hereinafter, a controller configured to support an interface with a new memory is referred to as a new memory controller.

The host 300 may access the semiconductor device 200, which is a device under test, using the memory controller 110. The memory controller 110 may write data in the semiconductor device 200 and read data from the semiconductor device 200 in response to commands of the host 300. The memory controller 110 may select an address of the semiconductor device 200 and write data in a memory region corresponding to the selected address or read data from the memory region.

The memory controller 110 may serve substantially similar functions to a memory controller used for a commercialized memory product, such as a USB flash drive (UFD), a solid-state drive (SSD), or moviNAND. The memory controller 110 may be provided as a single semiconductor package and include a logic configured to provide data communication between the memory controller 110 and the host 300.

In addition, the memory controller 110 may be an integrated memory controller configured to integrate the functions of at least one selected from the group consisting of a NAND flash memory controller, a NOR flash memory controller, an SRAM controller, a DRAM controller, and a new memory controller so that the tester 100 may test various kinds of semiconductor devices. In this case, to simultaneously test a NAND flash memory device, a NOR flash memory device, and a DRAM, the integrated memory controller may include respective signal lines corresponding to I/O signals of the memory devices. Alternatively, an interface type of the integrated memory controller may be differently designed in terms of software according to the kind of a tested memory device so that the tester 100 may sequentially test different kinds of memory devices. In this case, different kinds of tested memory devices may be packaged as the type of, for example, a single MCP.

A single memory controller 110 may not necessary be required to test a single semiconductor device 200. In other words, the memory controller 110 and the semiconductor device 200 may be provided on a one-to-one basis, a one-to-plural basis, or a plural-to-one basis.

For example, in the case of a multichip package (MCP) in which different kinds of memory devices are stacked in a single package, that is, an MCP including a random access memory (RAM) and a read-only memory (ROM), the RAM and the ROM may be allocated to a RAM controller and a ROM controller, respectively. In this case, two memory controllers 110 (i.e., the RAM controller and the ROM controller) may be required to test two semiconductor devices 200 (i.e., the RAM and the ROM).

In addition, to simultaneously test the RAM and ROM included in the MCP, a RAM/ROM integrated controller configured to integrate the functions of the RAM controller and the ROM controller may be employed. In this case, the RAM/ROM integrated controller may separately include signal lines configured to transmit and receive signals to and from the RAM and signal lines configured to transmit and receive signals to and from the ROM. Also, the RAM/ROM integrated controller may be designed to use at least one signal line for both a RAM interface and a ROM interface in terms of software. Furthermore, one memory controller 110 may be configured to test several memory devices of the same type or test different types of memory devices as described in more detail later.

According to an embodiment, the memory controller 100 may include a test program configured to test the semiconductor device 200. The memory controller 110 may perform a self-test on the semiconductor device 200 based on the test program in response to a test start command of the host 300. To this end, the memory controller 110 may include a control signal generator capable of generating control signals, an address generator capable of generating addresses, and a data generator capable of generating data patterns. The control signal generator, the address generator, and the data generator may generate the control signals, the addresses, and the data patterns, respectively, based on the test program.

The memory controller 110 may transmit a result of the self-test to the host 300 based on the test program. The result of the self-test may be obtained by writing specific data in the semiconductor device 200, reading the written data, and comparing the read data with the specific data. To this end, the memory controller 110 may include a comparator configured to compare a value read from the semiconductor device 200 with an expected value and determine whether the semiconductor device 200 is defective or not.

In addition, based on the self-test result, the memory controller 110 may indicate that a specific region of the semiconductor device 200 is defective or replace a defective cell or region by a redundancy cell or region. To this end, the memory controller 110 may include a failure processor. The failure processor may write an address of the defective cell or defective region in a specific region. In this case, a fuse corresponding to the defective cell or region of the tested semiconductor device 200 may be opened using a laser so that the semiconductor device 200 may be restored. Also, the failure processor may electrically open the fuse corresponding to the defective cell or region so that the semiconductor device 200 can be restored.

According to another exemplary embodiment, the host 300 may perform a test program required to test the semiconductor device 200. In this case, the memory controller 110 may passively input or output data to or from the semiconductor device 200 in response to control commands of the host 300. The host 300 may compare a value received from the controller 110 with an expected value and determine whether the semiconductor device 200 is defective or not. For example, the host 300 may write specific data in a memory region of the semiconductor device 200 using the memory controller 110, read the written data, and compare the read data with the specific data to determine whether the semiconductor device 200 is defective or not.

As shown in FIG. 1, the plurality of testers 100a, 100b, and 100c may be connected in parallel to the single host 300. The host 300 may transmit a test request to the respective testers 100a, 100b, and 100c, and each of the testers 100a, 100b, and 100c may independently test the semiconductor device 200 contacted therewith in response to the test request. Also, each of the testers 100a, 100b, and 100c may transmit a test result to the host 300. The plurality of testers 100a, 100b, and 100c may perform the above-described process at the same time. Therefore, the test system 10 according to the inventive concept may markedly shorten a test time and is not limited by the number of semiconductor devices 200 that may be tested at the same time.

Although FIG. 1 illustrates that the three testers 100a, 100b, and 100c are connected to the one host 300, the inventive concept is not limited by the number of testers. More or less than three testers may be connected to the one host 300 and simultaneously perform test operations.

Although FIG. 1 illustrates that one tester 100 includes one memory controller 110 and one contact unit 130, the one tester 100 may include a plurality of memory controllers 110 and a plurality of contact units 130 and test a plurality of semiconductor devices 200.

When the semiconductor device 200 is a semiconductor die or semiconductor wafer, the tester 100 may have the shape of a probe card. When the semiconductor device 200 is a semiconductor package, the tester 100 may have the shape of a test board. However, while a conventional probe card or test board functions only as an interface configured to provide an electrical path between a device under test and a test apparatus, the tester 100 according to the general inventive concept may directly test the semiconductor device 200 without a test apparatus.

Driving power required to drive the semiconductor device 200 may be supplied from the host 300. However, the tester 100 may include an additional power source (not shown) configured to supply driving power to the semiconductor device 200 and the memory controller 110.

The tester 100 may include a printed circuit board (PCB). For example, the memory controller 110 may be disposed on a first surface of the PCB and the contact unit 130 may be disposed on a second surface of the PCB corresponding to the memory controller 110. In this case, the tester 100 may test a relatively large number of semiconductor devices 200 per area.

Figure 2:
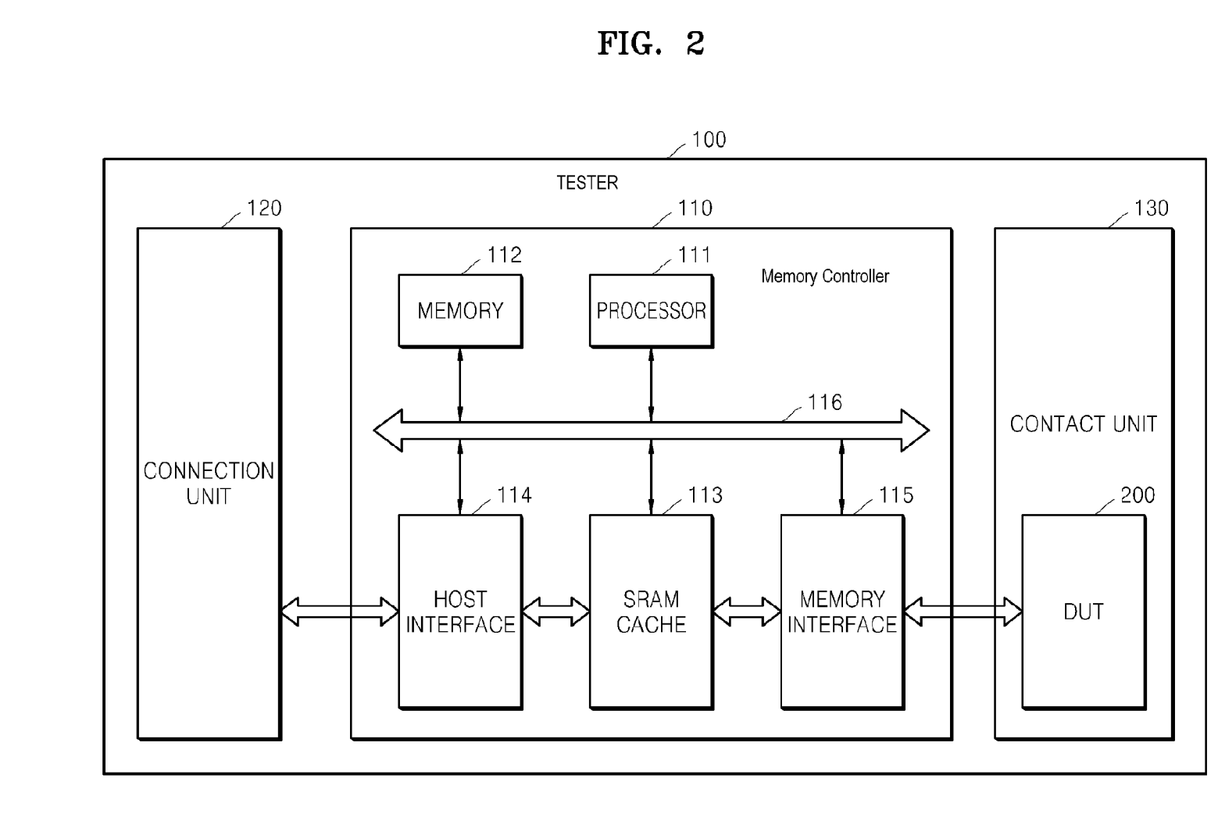
FIG. 2 is a schematic block diagram for explaining the function of a tester configured to test a semiconductor device according to an exemplary embodiment of the general inventive concept.

FIG. 2 is a schematic block diagram for explaining the functions of a tester 100 configured to test a semiconductor device according to an exemplary embodiment of the general inventive concept.

Referring to FIG. 2, the tester 100 may include a memory controller 110, a connection unit 120, and a contact unit 130. As described above, the connection unit 120 may enable communication between the memory controller 110 and the host (refer to 300 in FIG. 1), and the contact unit 130 may be connected to the semiconductor device 200 and provide an electrical path between the memory controller 110 and the semiconductor device 200.

Although FIG. 2 illustrates that one memory controller 110 corresponds to one contact unit 130, the one memory controller 110 may correspond to a plurality of contact units 130 and control and test the plurality of semiconductor devices (refer to 200 in FIG. 1).

The memory controller 110 may include a processor 111, a memory 112, an SRAM cache 113, a host interface 114, a memory interface 115, and a bus 116 configured to connect the processor 111, the memory 112, the SRAM cache 113, the host interface 114, and the memory interface 115 to one another.

The processor 111 may receive commands from the host 300 and determine whether data received from the host 300 is to be written in the semiconductor device 200 or data stored in the semiconductor device 200 is to be read and transmitted to the host 300. The processor 111 may be, for example, a central processing unit (CPU) or microprocessor. According to an exemplary embodiment, when a test program is stored in the memory 112, the processor 111 may load the test program and analyze and execute commands of the test program.

The memory 112 may store the test program as a firmware type in the memory 112 and downloaded by wires or wirelessly from the host 300 to the memory controller 110 before test operations. The memory 112 may include an electrically erasable and programmable read-only-memory (EEPROM).

The test program may include a test sequence and test data required to test the semiconductor device 200. For example, specific data may be written in a storage region of the semiconductor device 200, the written data may be read, the read data may be compared with the specific data, and it may be determined whether the semiconductor device 200 is defective or not based on the comparison result. When it is determined that a specific storage region is defective, the test program may be programmed to report the specific storage region to the host 300. Also, the test program may be programmed to replace the specific storage region by a redundancy region or indicate that the specific storage region is defective.

When the processor 111 includes a clock generator (not shown), the test program may be programmed to adjust a clock and determined whether the semiconductor device 200 normally operates within a required clock range.

The SRAM cache 113 may temporarily store data to be written in the semiconductor device 200 or data read from the semiconductor device 200. Also, the SRAM cache 113 may be used to store a test program to be executed by the processor 111. The SRAM cache 113 may be regarded as a kind of buffer memory and may not necessarily include an SRAM.

The host interface 114 may exchange data with the host 300 under the control of the processor 111. The host interface 114 may transmit commands received from the host 300 to the processor 111 through the bus 116. Data input from the host 113 through the host interface 114 under the control of the processor 111 may be stored in the SRAM cache 113, and data to be transmitted to the host 113 may be transmitted from the SRAM cache 113.

The memory interface 115 may exchange data with the semiconductor device 200. The memory interface 115 may be configured to support a NAND flash memory, a NOR flash memory, an SRAM, or a DRAM. Also, the memory interface 115 may support an interface with a new memory. Furthermore, when the semiconductor device 200 is a MCP in which different kinds of memory devices are stacked in one package, the memory interface 115 may support an interface with the different kinds of memory devices included in the MCP. The memory interface 115 and the semiconductor device 200 may transmit and receive control signals, such as various input/output (I/O) signals, and data DQ.

The bus 116 may be a path through which signals are received and transmitted between the processor 111, the memory 112, the SRAM cache 113, the host interface 114, and the memory interface 115.

According to an exemplary embodiment, when the processor 111 receives a test request from the host 300 through the host interface 114, the processor 111 may load the test program stored in the memory 112 and analyze and process commands of the test program. Before the processor 111 receives the test request from the host 300, the tester 100 may be wired or wirelessly connected to the host 300, download the test program, and store the test program in the memory 112.

The processor 111 may temporarily store the commands and data from the test program in the SRAM cache 113. The processor 111 may control data I/O operations of the semiconductor device 200 connected to the contact unit 130 through the memory interface 115. According to a test sequence of the test program, the processor 111 may write specific data in a specific region of the semiconductor device 200 and read the specific data again. The processor 111 may compare the read data with the specific data and determine whether the specific region is normal or not.

Figure 3:
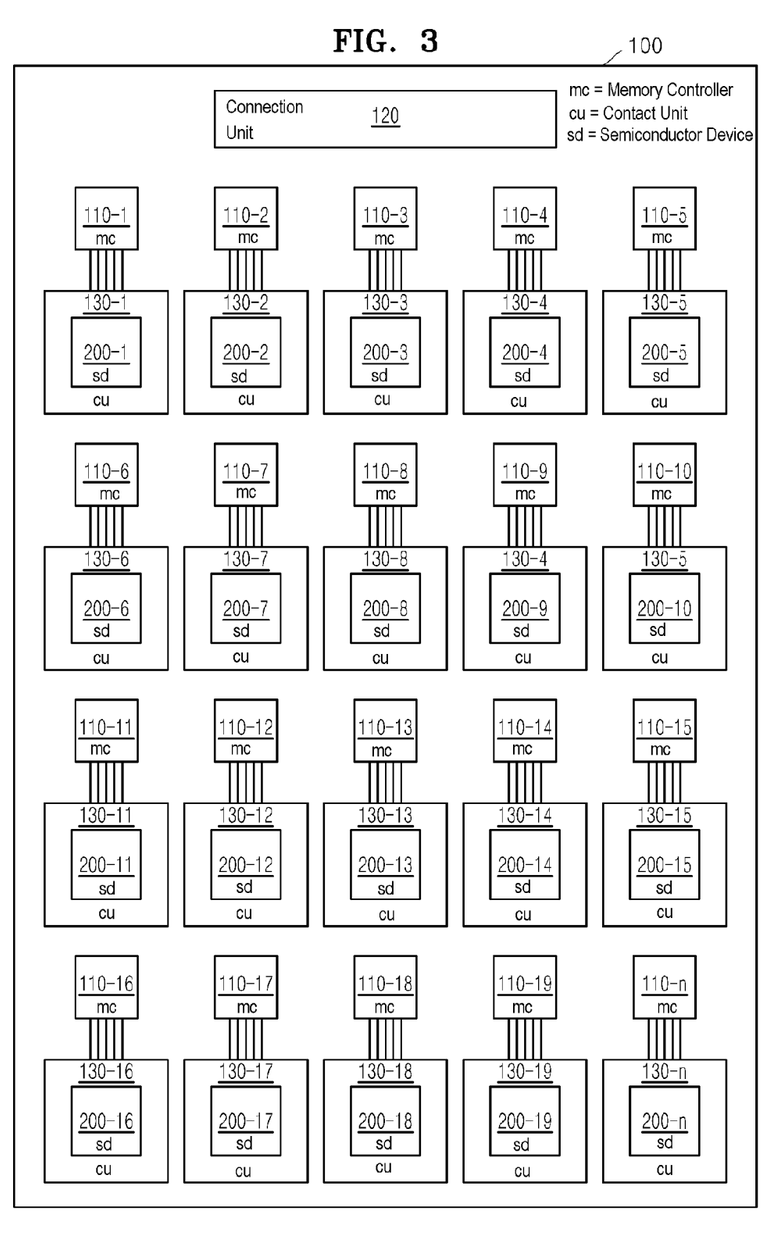
FIG. 3 is a schematic block diagram of a tester configured to test a semiconductor device according to an exemplary embodiment of the general inventive concept.

FIG. 3 is a schematic block diagram of a tester 100 configured to test a semiconductor device according to an embodiment of the inventive concept.

Referring to FIG. 3, the tester 100 may include one connection unit 120, a plurality of memory controllers 110-1 to 110-n, and a plurality of contact units 130-1 to 130-n. A plurality of semiconductor devices 200-1 to 200-n may be connected to the plurality of contact units 130-1 to 130-n, respectively. Also, the plurality of memory controllers 110-1 to 110-n may be connected to the plurality of contact units 130-1 to 130-n on a one-to-one basis. The inventive concept is not limited by the number of memory controllers 110-1 to 110-n and the number of contact units 130-1 to 130-n.

Although not shown in FIG. 3, the plurality of memory controllers 110-1 to 110-n may be connected to the connection unit 120 to be capable of communicating with the host (refer to 300 in FIG. 1). The host 300 may transmit test requests to the plurality of memory controllers 110-1 to 110-n. In response to the test requests, the plurality of memory controllers 110-1 to 110-n may independently test the corresponding ones of the semiconductor devices 200-1 to 200-n through the corresponding contact units 130-1 to 130-n.

The memory controllers 110-1 to 110-n may be of the same kind. However, the general inventive concept is not limited thereto and the memory controllers 110-1 to 110-n may be different kinds of memory controllers. For example, some memory controllers 110-1 to 110-10 may be flash memory controllers, while the remaining memory controllers 110-11 to 110-n may be SRAM memory controllers. Accordingly, the different kinds of semiconductor devices 200-1 to 200-n may be simultaneously tested in the one tester 100. This is because the semiconductor devices 200-1 to 200-n may be independently tested by the corresponding memory controllers 110-1 to 110-n. In addition, the semiconductor devices 200-1 to 200-n may be tested at substantially the same time.

The tester 100 may include a PCB including interconnection lines formed on the PCB between the connection unit 120 and the memory controllers 110-1 to 110-n and between the contact units 130-1 to 130-n and the corresponding memory controllers 110-1 to 110-n.

Figure 4:
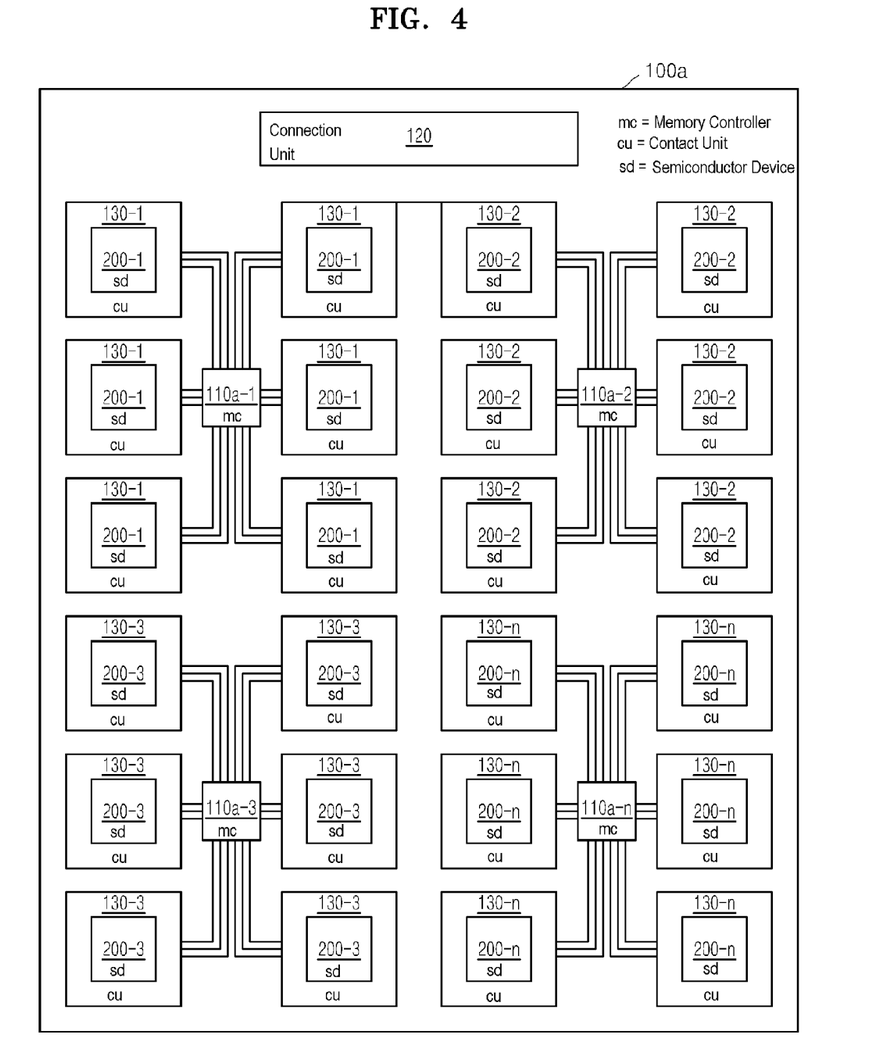
FIG. 4 is a schematic block diagram of a tester configured to test a semiconductor device according to another exemplary embodiment of the general inventive concept.

FIG. 4 is a schematic block diagram of a tester 100a configured to test a semiconductor device according to another exemplary embodiment of the inventive concept.

Referring to FIG. 4, the tester 100a may include one connection unit 120, a plurality of memory controllers 110a-1 to 110a-n, and a plurality of contact units 130-1 to 130-n. A plurality of semiconductor devices 200-1 to 200-n may be connected to the plurality of contact units 130-1 to 130-n, respectively.

The plurality of memory controllers 110a-1 to 100a-n may be connected to the plurality of contact units 130-1 to 130-n such that each of the memory controllers 110a-1 to 110a-n controls the plurality of corresponding semiconductor devices 200-1 to 200-n. Although FIG. 4 illustrates that six contact units 130-1 to 130-n are connected to each of the memory controllers 110a-1 to 110a-n, a greater or smaller number of contact units 130-1 to 130-n may be connected to each of the memory controllers 110a-1 to 110a-n. Also, the general inventive concept is not limited by the number of memory controllers 110a-1 to 110a-n and the number of contact units 130-1 to 130-n.

Although not shown in FIG. 4, the plurality of memory controllers 110a-1 to 110a-n may be connected to the connection unit 120 and communicate with the host (refer to 300 in FIG. 1). The plurality of memory controllers 110a-1 to 110a-n may independently test the plurality of corresponding semiconductor devices 200-1 to 200-n through the plurality of corresponding contact units 130-1 to 130-n.

The memory controllers 110a-1 to 110a-n may be of the same kind. However, the general inventive concept is not limited thereto and the memory controllers 110a-1 to 110a-n may be different kinds of memory controllers. Accordingly, because the semiconductor devices 200-1 to 200-n may be independently tested by the corresponding memory controllers 110a-1 to 110a-n, various different kinds of semiconductor devices 200-1 to 200-n may be simultaneously tested in a single tester 100a.

In addition, although the plurality of semiconductor devices 200-1 controlled by one memory controller (e.g., 110a-1) are denoted by the same reference numeral, the different kinds of semiconductor devices 200-1 may be controlled by the memory controller 110a-1 according to design conditions. For example, some of the semiconductor devices 200-1 may be flash memory devices, while the remaining semiconductor devices 200-1 may be SRAMs.

In this case, to simultaneously test different kinds of memory devices 200-1, the memory controller 110a-1 may include discretely separated channels corresponding to the respective memory devices 200-1. Alternatively, the memory controller 110a-1 may include a single channel having different interfaces corresponding to the respective memory devices 200-1 through the use of different software. Thus, the single memory controller 110a-1 may test the different kinds of memory devices 200-1.

For example, when an MCP that includes a NAND flash memory and a DRAM is to be tested, the memory controller 110a-1 may include signal lines respectively corresponding to I/O signals of both the NAND flash memory and the DRAM so as to simultaneously test the NAND flash memory and the DRAM. Alternatively, the memory controller 110a-1 may be configured such that at least one signal line is shared between the NAND flash memory and the DRAM, thereby sequentially testing the NAND flash memory and the DRAM. The above-described methods may be applied not only to an MCP in which different kinds of memory devices are stacked in one package but also to an MCP in which memory devices of the same kind are stacked in one package.

Furthermore, one memory controller (e.g., 110a-1) may independently test the plurality of semiconductor devices 200-1 connected thereto. To this end, the memory controller 110a-1 may assign different identification numbers (ID) to the respective semiconductor devices 200-1 to differentiate the semiconductor devices 200-1 from one another. In another example, the memory controller 110a-1 may assign different addresses to the plurality of semiconductor devices 200-1 to sequentially test the plurality of semiconductor devices 200-1. The memory controller 110a-1 may determine whether a specific cell or region of each of the semiconductor devices 200-1 is defective or not based on a problematic address.

Figure 5A:
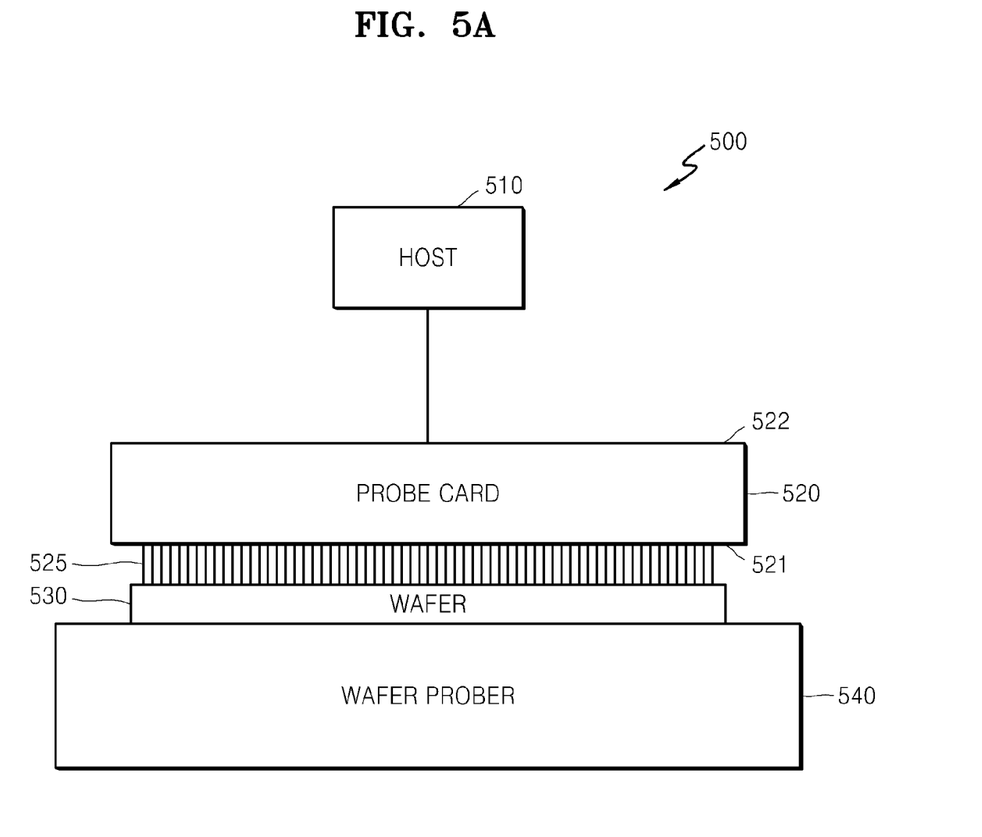
FIG. 5A is a schematic cross-sectional block diagram of a test system according to an exemplary embodiment of the general inventive concept.

FIG. 5A is a schematic cross-sectional block diagram of a test system 500 according to an exemplary embodiment of the general inventive concept.

Referring to FIG. 5A, the test system 500 may include a host 510, a probe card 520, a wafer prober 540, and a wafer 530 to be tested.

The host 510 may be a PC or a general-use computer, such as a work station, which is described above with reference to FIG. 1. Since the host 510 corresponds to the host 300 of FIG. 1, a description thereof will not be repeated here. The probe card 520 may be connected to the host 510, which may transmit a test request to the probe card 520.

The probe card 520 may have a flat panel structure including a first surface 521 facing a wafer 530 and a second surface 522 disposed opposite the first surface 521. For example, the probe card 520 may include a PCB.

Pins 525 capable of contacting the wafer 530 may be disposed on the first surface 521 of the probe card 520.

The wafer 530 may include semiconductor devices fabricated using a semiconductor fabrication process. Alternatively, the wafer 530 may include an array of semiconductor dies. The semiconductor dies may include contact pads connected to interconnections of internal circuits. The pins 525 of the probe card 520 may be electrically in contact with the contact pads of the wafer 530. The semiconductor devices may include memory devices capable of storing data. The wafer 530 may be disposed on the wafer prober 540.

The wafer prober 540 may adjust the position of the wafer 530 such that the contact pads of the wafer 530 are electrically in contact with the pins 525 of the probe card 520.

Figure 5B:
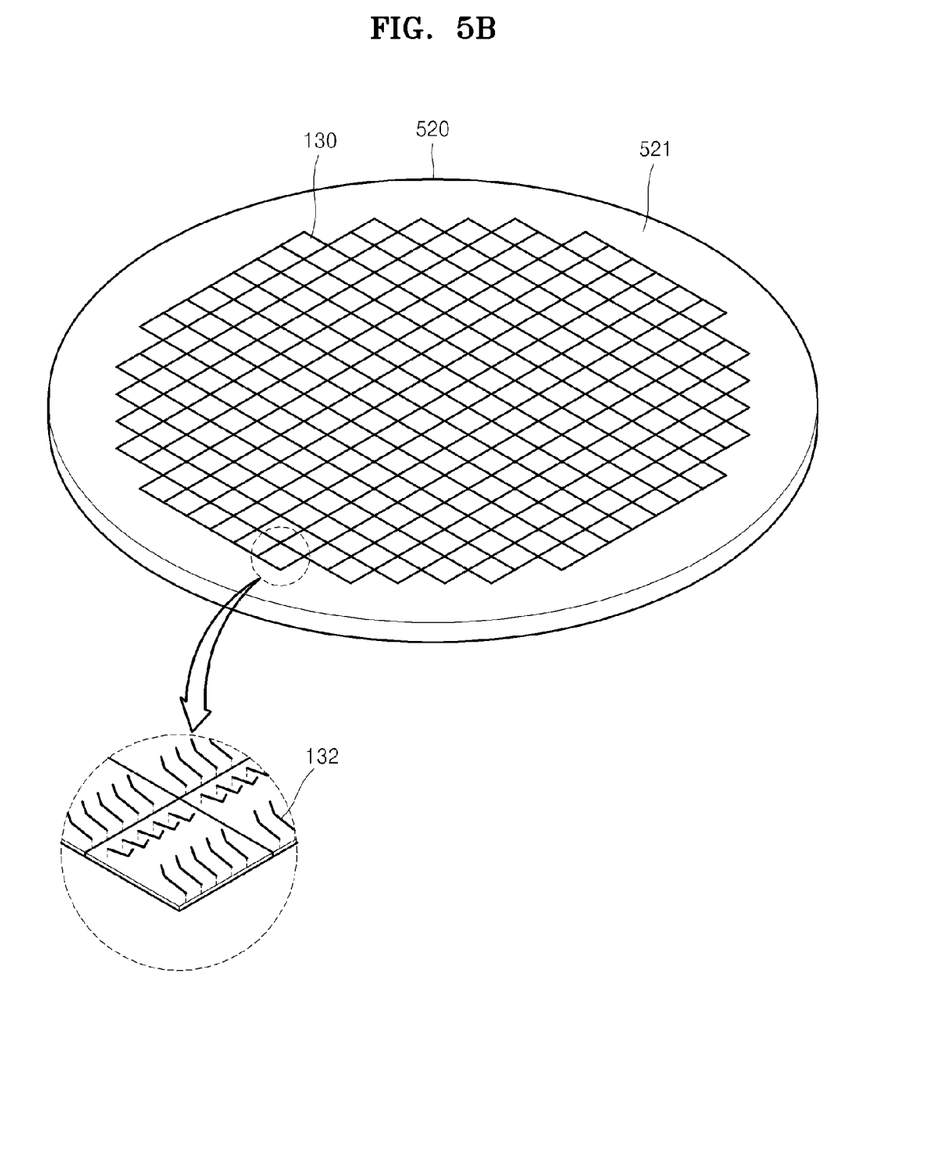
FIG. 5B is a schematic perspective view of a first surface of a probe card of FIG. 5A.

FIG. 5B is a schematic perspective view of the first surface 521 of the probe card 520 of FIG. 5A.

Referring to FIG. 5B, the first surface 521 of the probe card 520 is illustrated.

The first surface 521 of the probe card 520 may be in contact with the wafer (refer to 530 in FIG. 5A). A plurality of contact units 130 may be disposed on the first surface 521 to be in direct contact with the wafer 530. The contact units 130 may be arranged in positions corresponding to semiconductor dies of the wafer 530. As shown in a partial enlarged view of FIG. 5B, each of the contact units 130 may include needles 132 that may be in direct contact with the contact pads of the wafer 530. The shape and arrangement of the needles 132 shown in FIG. 5B are only an example, and the needles 132 may have the same shape as probe needles vertically protruding from the first surface 521. Power, control, and data signals may be applied to internal circuits of semiconductor dies of the wafer 530 through the needles 132.

Figure 5C:
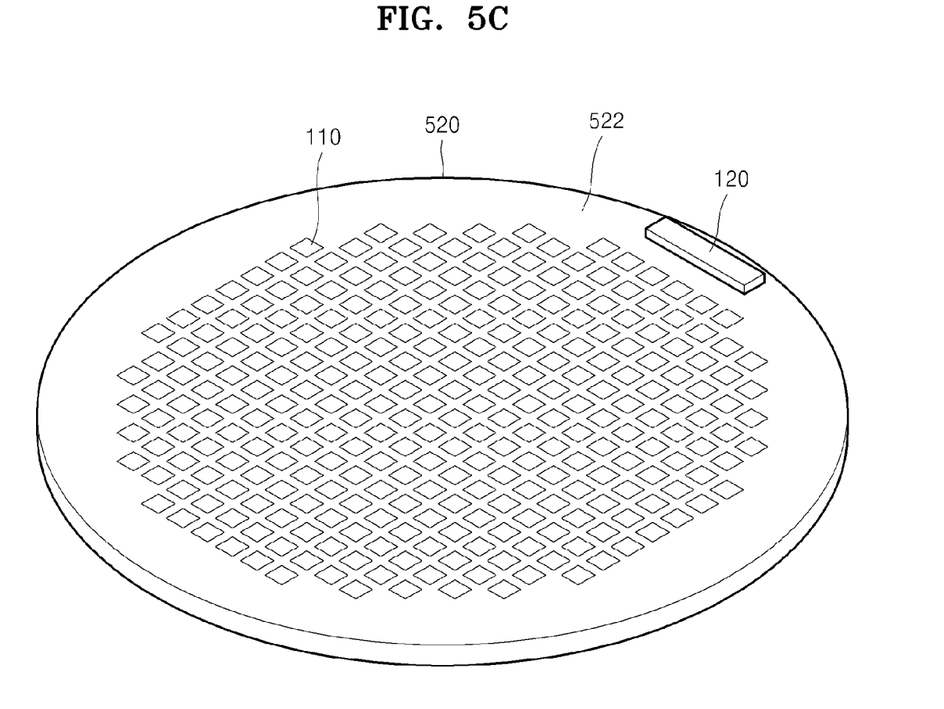
FIG. 5C is a schematic perspective view of a second surface of the probe card of FIG. 5B.

FIG. 5C is a schematic perspective view of a second surface 522 of the probe card 520.

Referring to FIG. 5C, the second surface 522 of the probe card 520 is illustrated.

The second surface 522 of the probe card 520 is opposite to the first surface 521. A plurality of memory controllers 110 may be disposed on the second surface 522. The memory controllers 110 may be arranged in positions corresponding to the contact units 130 of the first surface 521. The memory controllers 110, each of which includes a semiconductor package, may be mounted on the second surface 522 using sockets. Accordingly, the memory controllers 110 may be replaced by different kinds of memory controllers to perform test operations. Although shown in FIGS. 5B and 5C, the needles 132 disposed on the first surface 521 may be respectively connected to I/O pins of the memory controllers 110.

In addition, a connection unit 120 may be connected to the second surface 522. In particular, the connection unit 120 may be positioned closer to the periphery of the probe card 520 with respect to the memory controllers 110. That is, the memory controllers 110 may be positioned along the interior of the probe card 520 while the connection unit 120 is positioned along the periphery of the probe card 520. Although not shown in FIG. 5C, the connection unit 120 may be electrically connected to the memory controllers 110. The connection unit 120 may be a physical interface configured to communicate with the host 510 by wires or a wireless communication chip (e.g., RF chip) configured to wirelessly communicate with the host 510.

The memory controllers 110 may receive test requests from the host 510 through the connection unit 120 and respectively self-test semiconductor dies of the corresponding wafer 530. The memory controllers 110 may transmit test results to the host 300. Thus, since the test operation may be performed in wafer units, a test time may be markedly shortened.

FIGS. 5A through 5C illustrate the test system 500 configured to test the semiconductor wafer 530, it would be apparent to those skilled in the art that the present inventive concept may be applied to a test system configured to test a semiconductor die or an array of semiconductor dies.

Figure 6A:
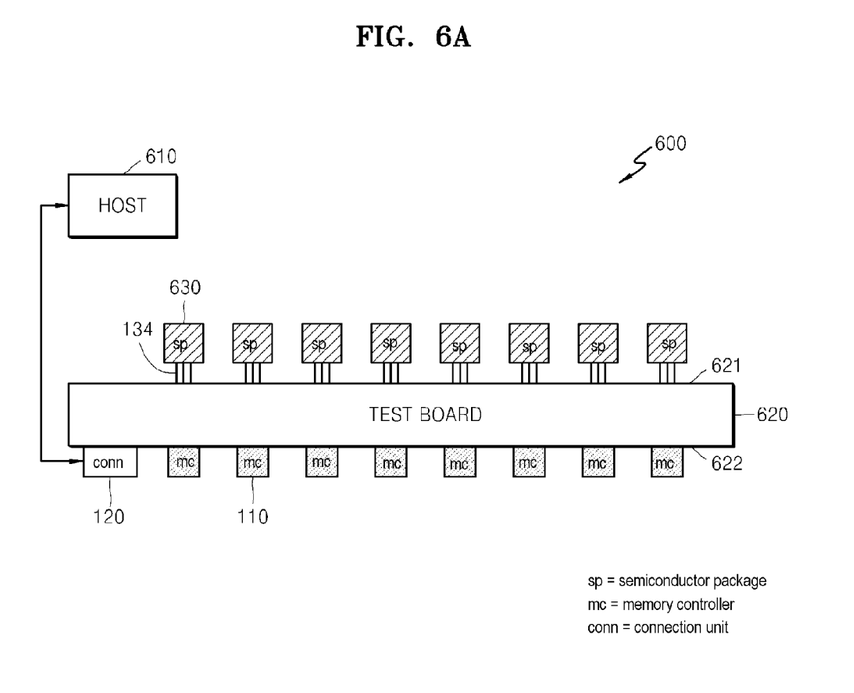
FIG. 6A is a schematic cross-sectional block diagram of a test system according to another exemplary embodiment of the general inventive concept.
Figure 6B:
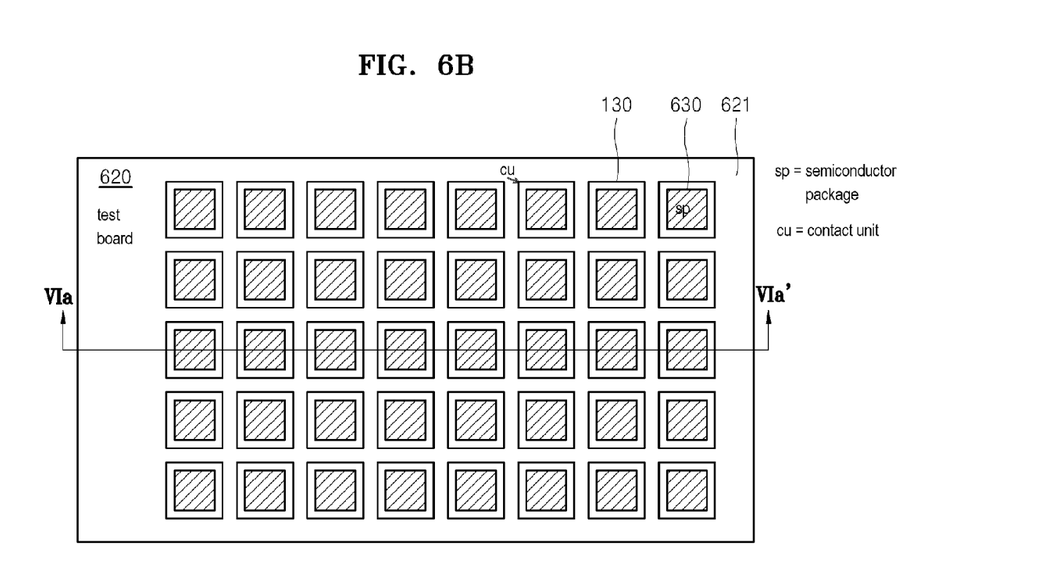
FIG. 6B is a schematic top view of a first surface of a test board of FIG. 6A.
Figure 6C:
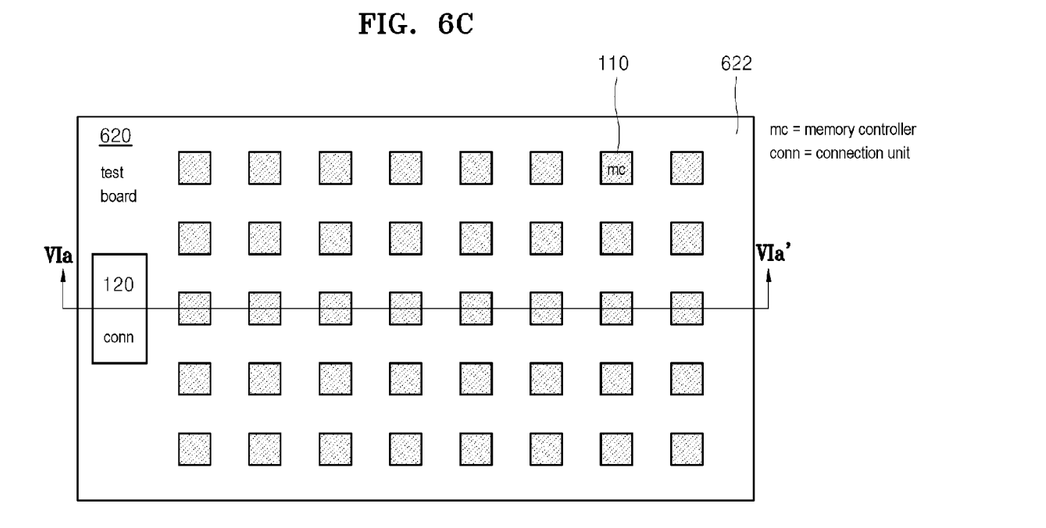
FIG. 6C is a schematic bottom view of a second surface of the test board of FIG. 6A.

FIG. 6A is a schematic cross-sectional block diagram of a test system according to another exemplary embodiment of the general inventive concept, FIG. 6B is a schematic top view of a first surface 621 of a test board of FIG. 6A, and FIG. 6C is a schematic bottom view of a second surface 622 of the test board of FIG. 6A.

Referring to FIGS. 6A through 6C, a test system 600 may include a host 610, a test board 620, and semiconductor packages 630.

The host 610 may be a PC or a general-use computer, such as a workstation, as described with reference to FIG. 1. Since the host 610 corresponds to the host 300 of FIG. 1, a description thereof will not be repeated here. The test board 620, which may be connected to the host 610, may transmit a test request to the test board 620.

The test board 620 may have a flat panel structure including a first surface 621 and a second surface 622 disposed opposite the first surface 621. For example, the test board 620 may include a PCB.

The contact units of the test system 600 may be similar to the contact units 130 in FIG. 1, and may be arranged on the first surface 621 of the test board 620 so as to be capable of contacting the semiconductor packages 630. The contact units 130 may include sockets into which the semiconductor packages 630 are inserted. Also, as shown in FIG. 6A, the contact units 130 may include pogo pins 134 configured to contact the surface-mounting-type semiconductor packages 630. Terminals of the sockets or the pogo pins 134 may be disposed in positions corresponding to I/O pins of the semiconductor packages 630. The semiconductor packages 630 may be disposed to be capable of contacting the contact units 130 by handlers.

The plurality of memory controllers 110 may be disposed on the second surface 622 of the test board 620. The memory controllers 110 may be arranged in positions corresponding to the positions of the contact units 130 on the first surface 621 of the test board 620. That is, the memory controllers 110 may be arranged at positions on the second surface 622 that are symmetric to positions of the contact units 130 arranged on the first surface 621 with respect to a plane extending through the center of the test board 620 that is parallel to the first and second surfaces 621 and 622. Further, the contact units 130 may be symmetrically arranged on the first surface 621 with respect to one another. Similarly, the memory controllers 110 may be symmetrically arranged on the second surface 622 with respect one another.

The memory controllers 110 may include semiconductor packages and be mounted on the second surface 622 of the test board 620 using the sockets. Terminals of the contact units 130 disposed on the first surface 621 of the test board 620 may be respectively connected to the I/O pins of the memory controllers 110.

Furthermore, the connection unit 120 may be disposed on the second surface 622 of the test board 620. Although not shown in FIG. 6C, the connection unit 120 may be electrically connected to the memory controllers 110.

Each of the memory controllers 110 may receive a test request from the host 610 through the connection unit 120 and discretely self-test the corresponding semiconductor package 630 in response to the test request. The memory controller 110 may transmit a test result to the host 300. Thus, the plurality of semiconductor packages 630 may be simultaneously tested, and a time required for testing may be significantly reduced.

Although a few exemplary embodiments of the present general inventive concept have been shown and described, it will be appreciated by those skilled in the art that changes may be made in these exemplary embodiments without departing from the principles and spirit of the general inventive concept, the scope of which is defined in the appended claims and their equivalents.

What is claimed is:

1. A tester to test a plurality of different types of semiconductor devices, the tester comprising:
    at least one contact unit to contact the semiconductor devices; and
    at least one controller chip connected to the at least one contact unit to control data input/output (I/O) operations of the semiconductor devices and to each test at least two different types of the semiconductor devices,
    wherein the at least one controller chip comprises at least two of an NAND flash memory controller, an NOR flash memory controller, a static random access memory (SRAM) controller and a dynamic RAM (DRAM) controller, corresponding to the at least two different types of the semiconductor devices.

2. The tester of claim 1, further comprising a connection unit configured to connect the tester with a host,
    wherein the at least one controller chip tests the semiconductor devices in response to a test request received from the host via the connection unit and transmits a test result to the host.

3. The tester of claim 2, wherein the controller chip comprises:
    a host interface configured to communicate with the host;
    a memory interface configured to connect to the semiconductor devices;
    a memory configured to store a test program to test the semiconductor devices;

a processor configured to control the data I/O operations of the semiconductor devices and to test the semiconductor devices according to the test program; and a bus configured to connect the host interface, the memory interface, the memory, and the processor with one another.

4. The tester of claim 1, further comprising a wireless communication unit configured to wirelessly communicate with the host.

5. The tester of claim 1, wherein the controller chip embeds the test program therein as a firmware type and performs a self-test on the semiconductor devices using the test program.

6. The tester of claim 1, wherein a plurality of contact units are provided and respectively configured to contact the semiconductor devices.

7. The tester of claim 6, wherein the controller chip is connected to the plurality of contact units, controls data I/O operations of the semiconductor devices connected respectively to the plurality of contact units, and simultaneously tests the plurality of semiconductor devices.

8. The tester of claim 6, wherein a plurality of controller chips is provided and respectively connected to the plurality of contact units on a one-to-one basis.

9. The tester of claim 8, wherein the tester further comprises a flat panel structure having a first surface and a second surface disposed opposite the first surface, wherein
the plurality of contact units is arranged on the first surface of the tester, and
the plurality of controller chips is arranged on the second surface of the tester.

10. The tester of claim 1, wherein the tester is a test board configured to test at least one multi-chip package, the at least one multi-chip package, each including the at least two different types of the semiconductor devices.

11. The tester of claim 10, wherein the contact unit includes a socket or a plurality of pogo pins corresponding to each of the at least one multi-chip package.

12. The tester of claim 1, wherein the tested at least two of different types of semiconductor devices comprises at least two of an NAND flash memory device, an NOR flash memory device, a static random access memory (SRAM) and a dynamic RAM (DRAM).

13. A test system configured to test at least two different types of semiconductor devices, the test system comprising:
a host configured to transmit a test request to test the semiconductor device and receive a test result of the semiconductor device; and
at least one tester connected to the host, the tester including:
a connection unit configured to connect the tester to the host;
at least two contact units configured to respectively contact the at least two different types of the semiconductor devices; and
a controller chip connected between the connection unit and the at least two contact units and configured to control data input/output (I/O) operations of the at least two different types of the semiconductor device, to test the at least two different types of the semiconductor devices in response to the test request of the host, and to transmit the test result to the host,
wherein the at least two different types of the semiconductor devices comprises at least two of an NAND flash memory device, an NOR flash memory device, a static random access memory (SRAM) and a dynamic RAM (DRAM),
wherein the controller chip comprises at least two of an NAND flash memory controller, an NOR flash memory controller, a SRAM controller and a DRAM controller, corresponding to the at least two different types of the semiconductor devices.

14. A tester configured to test a plurality of multi-chip packages, the multi-chip packages each including at least two different types of semiconductor devices, the tester comprising:
a plurality of contact units configured to establish contact with the plurality of multi-chip packages; and
a plurality of controller chips respectively connected to each of the plurality contact units, and configured to control data input/output (I/O) operations of the plurality of multi-chip packages via the plurality of contact units so as to test the plurality of multi-chip packages, such that at least one of the controller chips each tests the at least two different types of the semiconductor devices,
wherein the at least two different types of the semiconductor devices comprises at least two of an NAND flash memory device, an NOR flash memory device, a static random access memory (SRAM) and a dynamic RAM (DRAM),
wherein the at least one of the controller chips each comprises at least two of an NAND flash memory controller, an NOR flash memory controller, a SRAM controller and a DRAM controller, corresponding to the at least two different types of the semiconductor devices.

15. The tester of claim 14, further comprising:
a test board having a first surface and a second surface opposite the first surface, the first and second surfaces being substantially parallel to one another, wherein the plurality of contact units are arranged on the first surface and the plurality of controller chips is arranged on the second surface; and
a connection unit configured to connect the tester to a host that transmits a test request to test the plurality of multi-chip packages and receives test results of the plurality of multi-chip packages.

16. The tester of claim 15, wherein the plurality of contacts units are respectively arranged on the first surface at positions directly opposite to positions of the plurality of controller chips arranged on the second surface.

17. The tester of claim 16, wherein the connection unit is arranged on the second surface.

18. The tester of claim 15, wherein each of the plurality of controller chips comprises:
a host interface to communicate with the connection unit;
a memory interface to interface with the at least two different types of semiconductor devices in each of the plurality of multi-chip packages;
a memory to store at least two test programs to test two different types of semiconductor devices;
a processor to control the data I/O operations of the at least two different types of semiconductor devices and to test the at least two different types of semiconductor devices according to the at least two test programs; and
a bus configured to connect the host interface, the memory interface, the memory, and the processor with one another.

* * * * *